(12) United States Patent
Milosavljevic et al.

(10) Patent No.: US 7,608,497 B1
(45) Date of Patent: Oct. 27, 2009

(54) PASSIVATED TIERED GATE STRUCTURE TRANSISTOR AND FABRICATION METHOD

(76) Inventors: Ivan Milosavljevic, 2221 Summerpark Ct., Thousand Oaks, CA (US) 91362;
Adele Schmitz, 2221 Summerpark Ct., Thousand Oaks, CA (US) 91362;
Michael Antcliffe, 3165 Sawtelle Blvd. #216, Los Angeles, CA (US) 90066;
Ming Hu, 12832 Berkhamsted St., Cerritos, CA (US) 90703; Lorna Hodgson, 7106 Windaliere Dr., Cornelius, NC (US) 28269

( * ) Notice: Subject to any disclaimer, the term of this patent is extended or adjusted under 35 U.S.C. 154(b) by 217 days.

(21) Appl. No.: 11/517,685

(22) Filed: Sep. 8, 2006

(51) Int. Cl.
*H01L 21/338* (2006.01)
(52) U.S. Cl. .................. 438/182; 438/574; 438/579; 257/E21.205
(58) Field of Classification Search ............... 438/167, 438/172, 179, 182, 574, 577–579, 670–671, 438/951; 257/E21.205, E21.587
See application file for complete search history.

(56) References Cited

U.S. PATENT DOCUMENTS

| | | | |
|---|---|---|---|
| 5,053,348 A | | 10/1991 | Mishra et al. |
| 5,500,381 A | * | 3/1996 | Yoshida et al. ............... 438/172 |
| 5,693,548 A | | 12/1997 | Lee et al. |
| 5,770,525 A | | 6/1998 | Kamiyama |
| 5,981,319 A | | 11/1999 | Lothian et al. |
| 6,051,454 A | | 4/2000 | Anda et al. |
| 6,204,102 B1 | | 3/2001 | Yoon et al. |
| 6,294,446 B1 | * | 9/2001 | Ishikawa ................... 438/579 |
| 6,387,783 B1 | | 5/2002 | Furukawa et al. |
| 6,417,084 B1 | | 7/2002 | Singh et al. |
| 6,737,202 B2 | | 5/2004 | Gehoski et al. |
| 7,041,541 B2 | | 5/2006 | Behammer |
| 7,387,955 B2 | | 6/2008 | Ahn et al. |
| 7,439,166 B1 | * | 10/2008 | Milosavljevic et al. ...... 438/577 |
| 2003/0119233 A1 | | 6/2003 | Koganei |
| 2004/0063303 A1 | | 4/2004 | Behammer |
| 2004/0082158 A1 | | 4/2004 | Whelan et al. |
| 2007/0134862 A1 | | 6/2007 | Lim et al. |

OTHER PUBLICATIONS

R. Grundbacher, I. Adesida, Y.-C. Kao, A.A. Ketterson, Single step lithography for double-recessed gate pseudomorphic electron mobility transistors, J. Vac. Sci. Technol. B 15 (1), pp. 49-52, American Vacuum Society, Jan./Feb. 1997.
USPTO Notice of Allowance and Fees Due, mailed Jan. 14, 2009 for U.S. Appl. No. 11/517,791, filed Sep. 8, 2006, Inventor Milosavljevic.
USPTO Office Action (OA) mailed Nov. 29, 2007 for U.S. Appl. No. 11/150,439, filed Jun. 11, 2005, inventor Milosavljevic.

* cited by examiner

*Primary Examiner*—Thanhha Pham
(74) *Attorney, Agent, or Firm*—Christopher R. Balzan, Esq.

(57) ABSTRACT

A method for fabricating a tiered structure includes forming a gate on a semiconductor substrate. Formation of the gate includes depositing a gate foot using a gate foot mask having an opening through it to define the gate foot over the substrate. After forming the gate foot, the gate foot mask is stripped and a passivation layer is formed over the gate foot and the substrate. A gate head mask is formed over the gate foot with the gate head mask exposing a portion of the passivation layer on a top portion of the gate foot. The portion of the passivation layer on the top portion of the gate foot is removed to expose the top portion of the gate foot. A gate head is formed on the top portion of the gate foot using the gate head mask. A lift-off process is performed, removing the gate head mask.

17 Claims, 6 Drawing Sheets

PASSIVATED TIERED GATE STRUCTURE TRANSISTOR AND FABRICATION METHOD

CROSS-REFERENCE TO RELATED APPLICATION

The present application is related to U.S. patent application Ser. No. 11/150,439, issued as U.S. Pat. No. 7,439,166, by Milosavljevic, et al., entitled "METHOD FOR PRODUCING TIERED GATE STRUCTURE DEVICES, filed on Jun. 11, 2005, and to U.S. patent application Ser. No. 11/517,791, filed concurrently herewith, by Milosavljevic et al.; entitled TIERED GATE DEVICE WITH SOURCE AND DRAIN EXTENSIONS, both herein incorporated by reference in their entireties.

BACKGROUND

FIG. 1 shows a cross section side view of a prior art T-gate structure transistor 100. The T-gate structure transistor 100 has a T-shaped gate 125, which is often referred to as simply a T-gate. In general a T-gate is any device which has a narrow gate foot 65 and a relatively wider gate head 165. Sometimes the same or similar structures are referred to as Y-gates and/or mushroom gates due to their final shape. In yet another instance, a gamma-gate or asymmetric gate can be produced. A gamma-gate has a cross section similar to the Greek letter gamma. Accordingly, the terms T-gate, Y-gate, mushroom gate, gamma-gate, and asymmetric gate refer to a tiered gate structure with a narrow gate foot 65 and a relatively wider gate head 165. In this disclosure the term T-gate, the most general and widely used term to refer to such tiered gate structure devices, is intended to encompass all of these structural variations.

Most T-gate processes utilize electron beam lithography to produce short gate length devices. While gate lengths less than 100 nanometers are commonly achievable, the short height of the gate foot 65 (the distance between the surface of the substrate 110 and the bottom of the gate head 165) required to produce such short gate lengths, creates unwanted parasitics between the gate head 165 and a source 120, and between the gate head 165 and a drain 130, indicated as $C_{gs}$ and $C_{gd}$, respectively. This occurs because of the aspect ratio limitation between feature size and resist thickness in electron beam lithography. Electrons undergo forward and back scattering during exposure which limit the minimum feature size to around half of the resist thickness at a 50 kV acceleration voltage. This short separation also hinders nitride coverage of the gate structure 125 during passivation.

Traditional fabrication methods of the T-gate structure 125 are performed with one or two exposure passes. In the two exposure pass method, during the first exposure, the top resist is exposed to define the gate head 165. The lower resist which will define the gate foot 65, is partially exposed in the first exposure, but not enough to develop it. The top resist is developed and a second exposure is used to define the gate foot 65. This creates a history on the lower resist layer, which can cause non-uniformities in the gate foot 65 to occur across the wafer.

In addition to non-uniformities in the gate foot 65, voids 167 and 168 will form on either side of the gate foot 65 during metal evaporation. The voids 167 and 168 extend upward between the gate foot 65 and gate head 165 and can present a reliability problem for the T-gate structure transistor 100.

Also, a downward extending recess 169 will form in the top of the gate head 165 during metal evaporation. The recess 169 may also present a reliability problem for the T-gate structure transistor 100.

Once the T-gate structure transistor 100 is formed on the substrate 110, a passivation layer is typically formed on the substrate 110 around the T-gate to protect the surface of the substrate 110. For example, the passivation layer can insulate the surface of the substrate 110 from the ambient environment and prevent the surface from oxidizing. The passivation layer may be a nitride layer formed on the substrate 110 by using a plasma enhanced chemical vapor deposition process. Because the gate head 165 overhangs the gate foot 65, the passivation layer may be non-uniform under the gate head 165 around the gate foot 65. Consequently, the surface of substrate 110 under the gate head 165 is less protected, which may result in reliability and performance problems in a T-gate transistor including the T-gate. Moreover, the non-uniformity of the passivation layer around the gate foot 65 may increase the capacitance between the gate head 165 and the source 120, as well as the capacitance between the gate head 165 and the drain 130. These increases in capacitance may degrade the frequency response of the T-gate transistor.

In light of the above, there exists a need to improve passivation coverage of a substrate around the gate foot of a T-gate structure. Further, there exists a need to reduce the gate to source capacitance and the gate to drain capacitance of a T-gate structure transistor.

SUMMARY

In one implementation, a method for fabricating a tiered structure includes forming a gate foot on a substrate, and forming a passivation layer on the substrate around the gate foot. A gate head is formed on the gate foot and a portion of the passivation layer.

In one implementation, a method for fabricating a tiered structure is provided, which includes forming a source and a drain on a substrate with a gate formed therebetween. The gate includes a gate foot formed on the substrate and a gate head formed on the gate foot. A passivation layer is formed around the gate foot and may support the gate head along with the gate foot.

In one implementation, a method of fabricating a tiered gate structure includes forming a gate foot mask on a substrate, forming a gate foot in an opening of the gate foot mask, and removing the gate foot mask. The method also includes forming a passivation layer on the substrate and the gate foot, and forming a gate head mask over the gate foot. The gate head mask has an opening therethrough exposing a portion of the passivation layer on a top portion of the gate foot. The method further comprises removing the portion of the passivation layer to expose the top portion of the gate foot, and forming a gate head on the gate foot.

In one implementation, a tiered gate structure includes a gate foot, a gate head, and a passivation layer. The gate foot has a top portion, and the passivation layer surrounds the top portion. The gate head is coupled to the top portion of the gate foot and is partially supported by the passivation layer.

BRIEF DESCRIPTION OF THE DRAWINGS

The features and advantages of the present invention will be better understood with regard to the following description, appended claims, and accompanying drawings where:

DESCRIPTION

In the description of the invention that follows, like numerals or reference designators will be used to refer to like parts throughout. Furthermore, the FIGS. are for illustrative purposes and are not necessarily to scale.

Disclosure of Related application Ser. No. 11/150,439

Figure 2A:
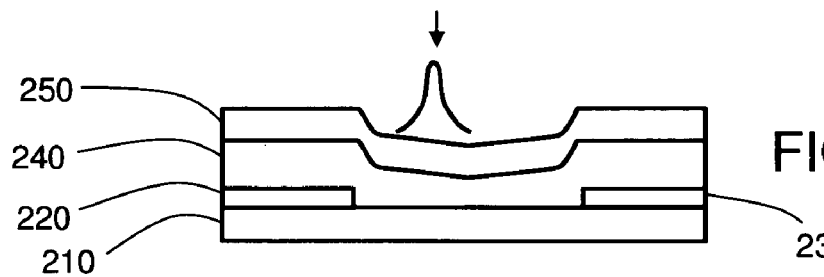
FIGS. 2A-2C are simplified illustrations in cross sectional side view illustrating fabrication of a gate foot of a T-gate device in accordance with an implementation of the present invention.
Figure 2B:
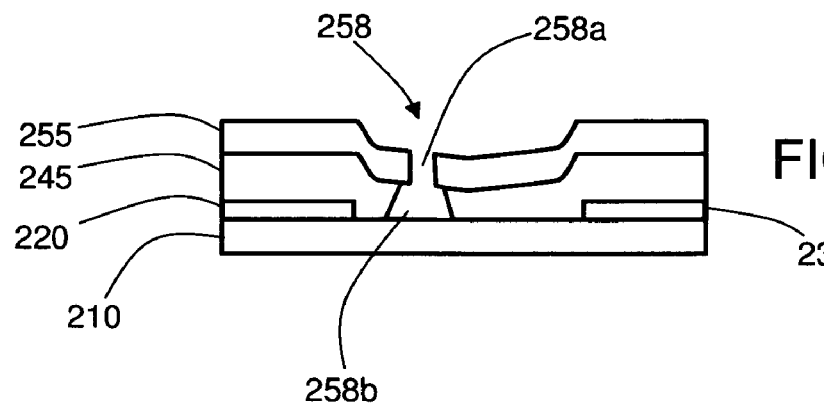
Figure 2C:
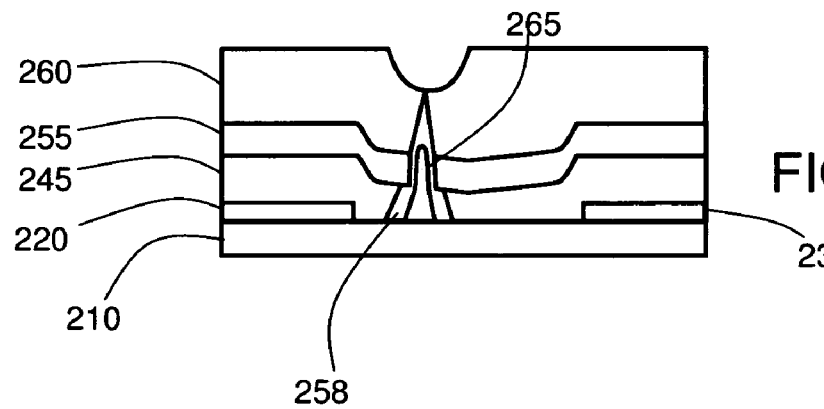

FIGS. 2A-2C are simplified illustrations in cross sectional side view illustrating fabrication of a gate foot 265 of a T-gate device (not shown) in accordance with an implementation of the present invention. FIG. 2A shows a substrate 210 with two dissimilar resist layers 240 and 250 overlying the source 220, the drain 230, and the substrate 210. The dissimilar resist layers 240 and 250 are selected so that they are based on different solvents and will not intermix. For example, the lower resist layer 240 may be copolymer resist such as MMA/MAA, and the upper resist layer 250 may be PMMA 950K. The lower resist layer 240 is a high sensitivity resist while the upper resist layer 250 is a low sensitivity resist. It is possible in some implementations to use a single resist layer rather than two.

A first exposure (indicated as an arrow above a gaussian curve at the top of FIG. 2A) with a high acceleration e-beam having a single peak gaussian like profile defines a narrow gate foot opening 258 (shown in FIG. 2B) in the mask defined by upper and lower resist layers 255 and 245 (shown in FIG. 2B). The exposure acceleration voltage will depend on the desired thicknesses and types of resist in the upper and lower resist layers 250 and 240. The exposure acceleration voltage indicated in FIG. 2A by the arrow, may be about 50 kV, for example.

After the first exposure, the resist layers 250 and 240 are developed using two different developers. The first developer does most of the developing of the upper resist layer 250, while the second developer is selective to develop only the lower resist layer 240. Thus, an under cut of the upper resist layer 255 by the lower resist layer 245 is possible to leave a well defined wider opening 258b in the lower resist layer 245 adjacent the substrate 210, with the upper resist layer 255 overhanging the lower resist layer 245, as shown in FIG. 2B.

The narrower opening 258a in the upper resist layer 255 defines the width of the gate foot 265, i.e. the gate length, on the substrate 210, shown in FIG. 2C.

Shown in FIG. 2C, a gate foot 265 is formed in the opening 258. An optional gate etch may be performed with a wet etch, to etch slightly into the substrate 210 prior to formation of a gate foot 265. The wider opening 258b (shown in FIG. 2B) in the lower resist layer 245 allows a uniform gate etch (not shown) across the surface of the substrate 210 where the gate foot 265 attaches to the substrate 210. In addition, it allows the gate etch and gate foot formation with a single mask formed by resist layers 255 and 245. Deposition of the gate foot material layer 260 results in the formation of the gate foot 265 on the substrate 210 through the opening 258 in the mask formed by the resist layers 255 and 245. The gate material is a conductor material, which typically is a metal such as gold, TiPt, Al, chrome, or the like.

A lift-off process (known in the art) removes the gate foot material layer 260 with the removal of the resist layers 245 and 255. After the lift-off process, the width (gate length) of the gate foot 265 and the height of the gate foot 265 may be measured, prior to formation of the gate head 365 (shown in FIG. 3C). This allows the gate length to be measured early in the manufacturing process, even in situ if desired, without requiring destruction of the T-gate device to perform the measurement. The gate etch length and the source-to-gate spacings can also be measured at this time.

Also, electrical measurements of the gate foot 265 may be conducted prior to completion of the T-gate device. For example, DC measurements may be made to determine if the gate foot 265 is functioning properly. Thus, it is possible to make measurements of the transconductance, resistance, etc., prior to completing fabrication of the T-gate device.

Figure 3A:
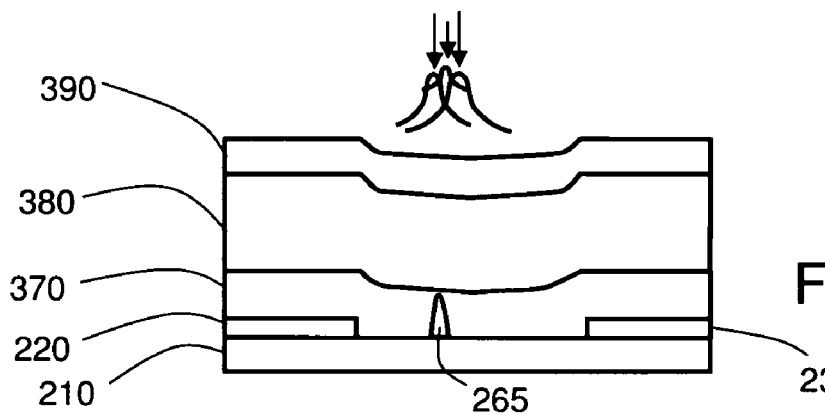
FIGS. 3A-3C are simplified illustrations in cross sectional side view illustrating fabrication of a gate head of a T-gate device in accordance with an implementation of the present invention.
Figure 3B:
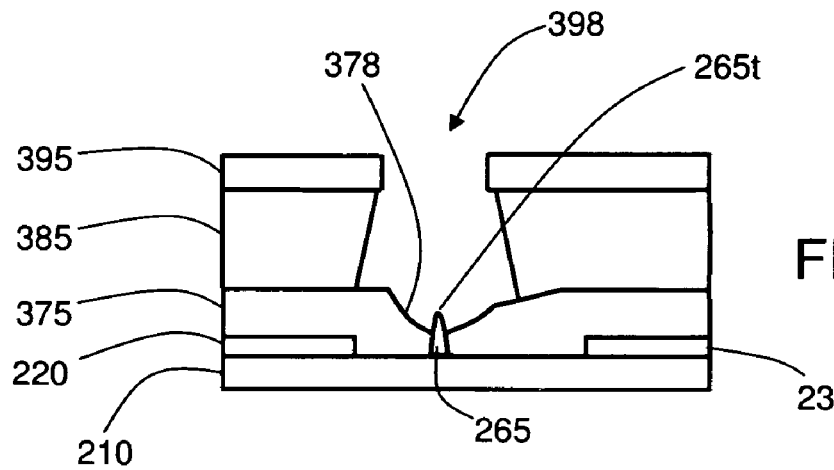
Figure 3C:
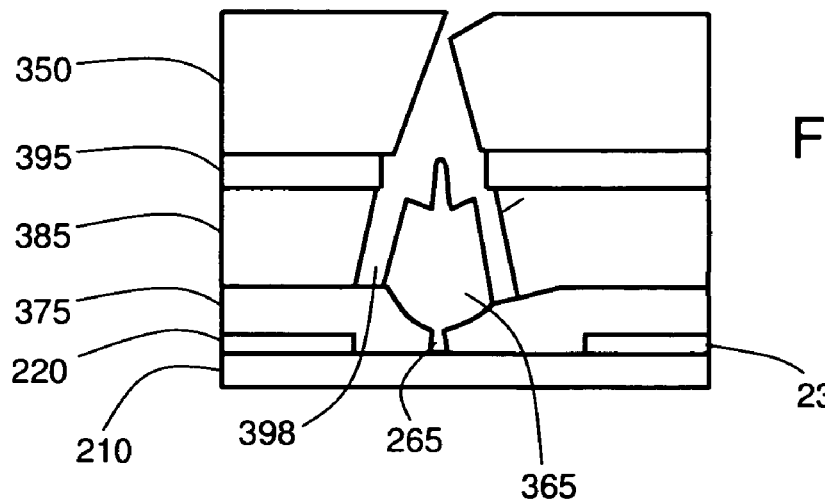

FIGS. 3A-3C are simplified illustrations in cross sectional side view illustrating fabrication of a gate head 365 of a T-gate device (not shown) in accordance with an implementation of the present invention. After formation of the gate foot 265, the gate head 365 is formed. Three layers of resist 370, 380, and 390 are deposited over the gate foot 265. Dissimilar resists can be used so that adjacent resist layers do not intermix. The lower resist layer 370 is deposited thick enough to cover the gate foot 265 and may be a medium sensitivity resist, such as PMMA 495k. The middle resist layer 380 acts as a spacer between upper and lower resist layers 390 and 370 and can be relatively thick as compared to resist layers 390 and 370. The middle resist layer 380 may be a high sensitivity resist of copolymer, such as MMA(17.5)/MAA. The upper resist layer 390 can be an imaging layer and may be a medium sensitivity resist, such as PMMA 495k.

A second exposure, (indicated as three arrows above three gaussian curves at the top of FIG. 3A) exposes resist layers 390, 380, and 370 shown in FIG. 3A. After exposure, the resist layers 390, 380, and 370 are developed leaving an opening 398 in the mask formed by the resist layers 395, 385, and 375 as shown in FIG. 3B. Although it is possible to use a single peak gaussian like profile to define the opening 398, in the implementation of FIG. 3A the e-beam exposure may use overlapping sidelobe doses with a light centerline dose (as indicated by the smaller gaussian curve at the top of FIG. 3A). The resulting exposure forms a gaussian distribution in the resist layers 370, 380, and 390. This is depicted in FIG. 3A as three overlapping gaussian like profiles. For this second exposure, it is possible to use a low voltage, such as 20 kV. As discussed further below with reference to FIG. 3C, the exposure energy and the develop time are selected so that the top surface 265t of the gate foot 265 is not covered by resist layers 390, 380 or 370 after developing, but does leave some of the lower resist layer 370 next to the gate foot 265. Thus, the lower resist layer 370 is not developed all the way through to the substrate 210, or expose the source 220 or drain 230. Instead, some of the lower resist layer 370 will remain adjacent the sides of the gate foot 265 and over the source 220 and drain 230 after developing.

Turning to FIG. 3B, after second exposure, a developer is selected which removes the exposed portion of the upper resist layer 395 and part of the middle resist layer 385. For example, Methyl-isobutyl-ketone or MIBK may be used to remove the exposed portion of an upper resist layer 395 formed of PMMA and part of the exposed portion of a middle resist layer 385 formed of MMA(17.5)/MAA copolymer. Next the developed portion of the middle resist layer 385 of MMA(17.5)/MAA copolymer is removed with a PMGEA: ETOH (1:5) solution. This solution does not affect the PMMA of the lower resist layer 375 or the upper resist layer 395. A dimple 378 in the lower resist layer 375 is formed using MIBK developer to uncover the top of the gate foot 265. The second exposure energy, the type and strength of the developer, and the develop times, are selected to ensure that only a top portion 265$t$ of the gate foot 265 is uncovered without uncovering the substrate layer 210, the source 220, or the drain 230.

It should be noted that although the above implementation is discussed with reference to exposure followed by the develop stages, it is possible in other implementations to perform the exposure and develop of resist layers 390, 380, and 370 in one or more alternating exposure and develop stages. In some implementations, it is possible to inspect resist layer 375 to determine if the top of the gate foot 265 is uncovered, before deposition of the gate head 365. If it is not, an additional exposure and/or develop may be performed. The gate foot 265 is distinguishable from the resist by inspection, such as with an electron microscope, or other inspection tool. As such, it is possible to verify in situ whether the processes parameters, such as for example the exposure dosages and develop times are providing the best possible process uniformity. This provides process feedback that allows refinement of the parameters without having to complete fabrication of the device. It also allows for remedial action prior to complete fabrication of the device.

In one possible implementation, after developing the lower resist layer 375 to uncover a top portion of the gate foot 265, an etch may be performed to remove any surface passivation, or oxidation, from the top portion of the gate foot 265 prior to gate head deposition. This ensures good electrical properties at the interface of the gate foot 265 and the gate head 365.

The resist profile formed in the resist layers 395, 385, and 375 define the gate head 365. Since a continuous profile faces the deposition source, during deposition, no voids will form between the gate foot 265 and the gate head 365. The gate head material may be deposited by various deposition techniques known in the art, such as for example by metal evaporation, sputtering, or other deposition technique. The opening 398 in the mask formed by resist layers 395, 385, and 375 defines the gate head 365 during the gate head deposition process. After deposition, the gate head material layer 350 is removed with a lift-off process by stripping the resist layers 375, 385, and 395 with a solvent, such as acetone. Other resists, developers, and stripper solutions are possible, but should be compatible with the particular substrate material being utilized, i.e. InP, GaAs, GaN, Si, SiC, etc.

Figure 1:
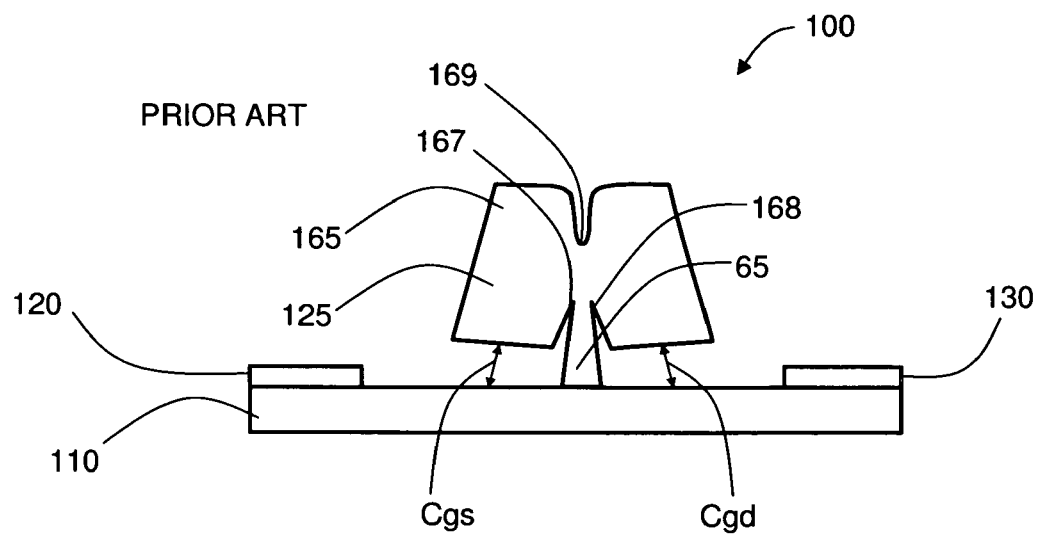
FIG. 1 shows a cross section side view of a prior art T-gate structure transistor.
Figure 4:
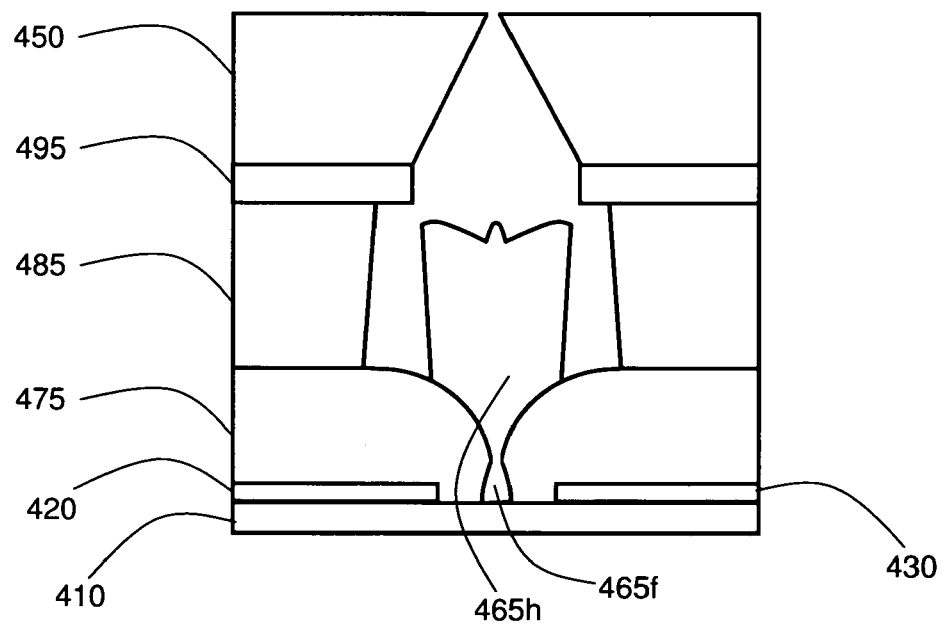
FIG. 4 is a cross section side view of a partially fabricated Y-gate structure transistor.

Turning to FIG. 4, certain implementations of the present invention allow for reduced parasitic capacitances as compared to a conventional T-gate formed with conventional processes. The embodiment of FIG. 4 is sometimes also referred to as a Y-gate structure. The lower resist layer 475 can be deposited over the gate foot 465$f$ with a greater thickness than when forming the entire gate structure with one deposition, such as metallization. This increases the distance between the gate head 465$h$ and the source 420 and between the gate head 465$h$ and the drain 430, thereby decreasing the gate-to-source and the gate-to-drain parasitic capacitances. Thus, in addition to reducing voids, reduced parasitic capacitances are achievable.

The e-beam exposure profile (not shown) is selected to provide a more narrow profile through the lower resist layer 475 to the gate foot 465$f$. As in the above implementation, the upper resist layer 495 and gate material layer 450 are removed in a lift-off process when the middle resist layer 485 is stripped.

Figure 5A:
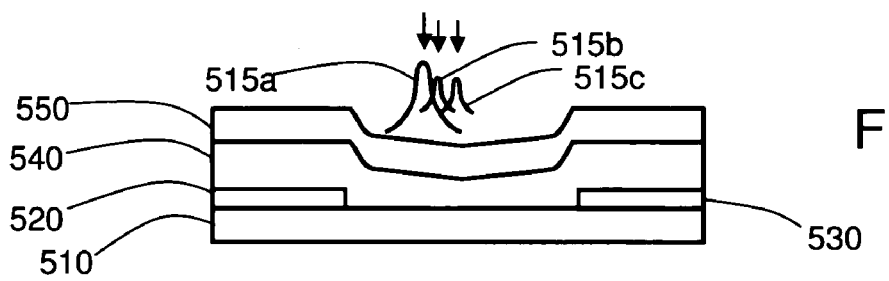
FIGS. 5A and 5B are simplified illustrations in cross sectional side view illustrating fabrication of a gate foot of a T-gate device in accordance with an implementation of the present invention.
Figure 5B:
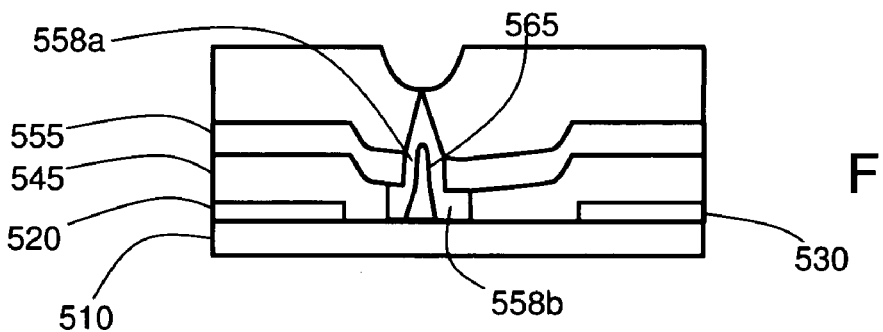
Figure 6A:
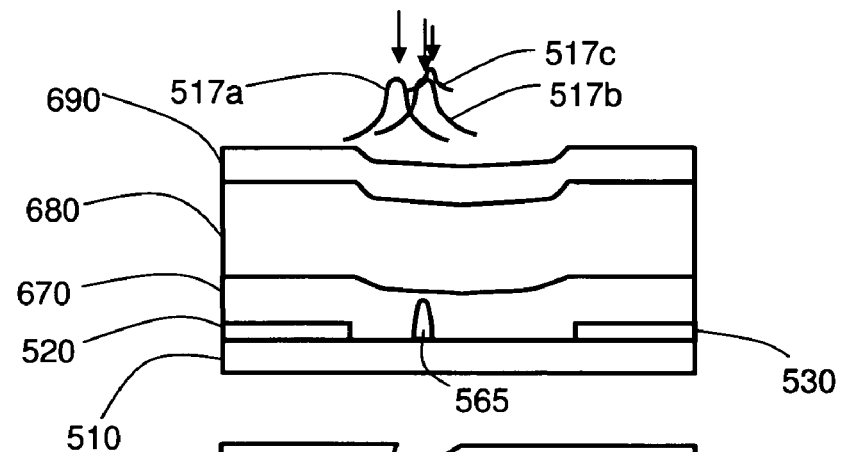
FIGS. 6A and 6B are simplified illustrations in cross sectional side view illustrating fabrication of a gate head of a gamma gate device (not shown) in accordance with an implementation of the present invention.

FIGS. 5A and 5B are simplified illustrations in cross sectional side view illustrating fabrication of a gate foot 565 of an asymmetric gate etch device (not shown) in accordance with an implementation of the present invention. An asymmetric gate or gamma gate is illustrated in U.S. Pat. No. 5,693,548, by Lee, et al., entitled METHOD FOR MAKING T-GATE OF FIELD EFFECT TRANSISTOR, issued Dec. 2, 1997, herein incorporated by reference. In the implementation of FIGS. 5A-6B, the gate etch of the substrate 510 etch is asymmetric, with the gate foot 565 being deposited on the substrate 510 closer to the source 520 side of the gate etch. This can improve the breakdown voltage by spreading the space charge layer on the drain side of the gate. Along with this, the short distance between the gate foot 565 and the source 520 reduces the source resistance. This structure can be created by adding a light exposure on the drain side of the gate foot exposure as indicated in FIG. 6A (as indicated by an arrow above the smaller gaussian curve 517$c$ at the top of FIG. 6A). The exposure dose should be light enough to remove the underlying copolymer layer but not the overlying PMMA 950K layer when developed.

Referring to FIGS. 5A and 5B, as above, two dissimilar resist layers 550 and 540 are exposed with an e-beam 515$a$-$c$. In this implementation, in forming the gate foot 565, the e-beam has a distribution with a larger dose 515$a$ for developing the upper resist layer 550, and lighter doses 515$b$ and 515$c$ for developing the lower resist layer 540 delivered at the side of the larger dose 515$a$. For example, a total dose of 50 kV with the lighter doses 515$b$ and 515$c$ having peaks aligned to the right side of the peak of the larger dose 515$a$ (indicated as three arrows above three gaussian curves at the top of FIG. 5A).

The larger dose 515$a$ defines the opening 558$a$ through the upper resist layer 555, while the lighter doses 515$b$ and 515$c$ define an off set opening 558$b$ in the lower resist layer 545. The lighter doses 515$b$ and 515$c$ develop the copolymer of the lower resist layer 545 and leave behind the PMMA of the upper resist layer 555. This is due to the relative sensitivities in developing of the two resists layers 555 and 545. As shown in FIG. 5B, the exposure pattern 515$a$-$c$ can be used to create the asymmetric etch and provide a gate foot 565 that is off set away from the drain 530.

Figure 6B:
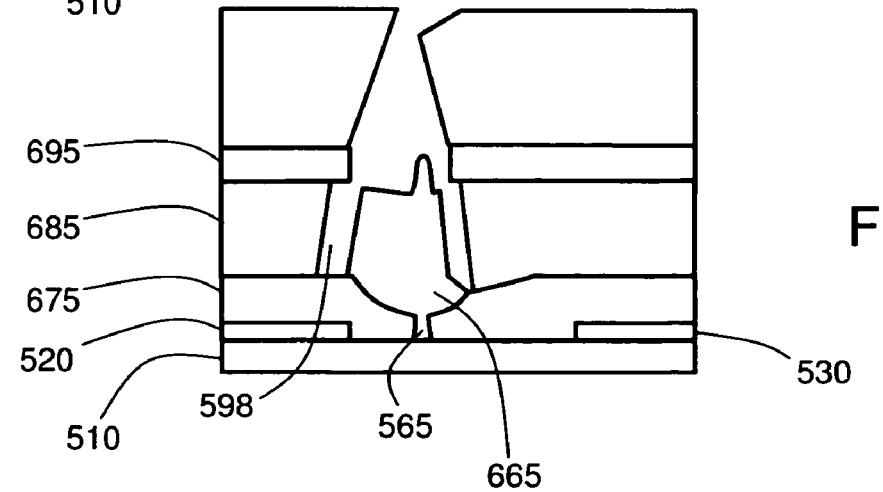

Turning to FIGS. 6A and 6B, the gate head 665 is formed on the gate foot 565, off set from the gate foot 565. Since the gate foot 565 and the gate head 665 are formed with separate exposures and depositions, the relative placement of the gate head 665 with respect to the gate foot 565 may be controlled. As above, three resist layers 670, 680, and 690 are deposited over the gate foot 565. The three resist layers are exposed with several e-beam doses (indicated as three arrows above three gaussian curves at the top of FIG. 6A). This defines an opening 598 in the resist layers 695, 685, and 675. The opening 598 is formed similar to the opening 398 discussed above with reference to FIG. 3B. Although it is possible to use a single, or a double peak gaussian like profile, in the implementation of FIG. 6A the e-beam exposure takes place using several doses, with one 517b having its peak centered over the gate foot 565 and another 517a having its peak off set to a side of the gate foot 565. Yet another, smaller dose 517c may be centered over the gate foot 565, as illustrated in FIG. 6A. For this exposure, it is possible to use a low voltage, such as 20 KV.

The resulting opening in the resist layers 695, 685, and 675 uncovers the gate foot 565 and is off set to the side of the gate foot 565. Thus, the gate head 665 is not centered above the gate foot 565 and centered between the source 520 and drain 530. Instead, the gate head 665 is located closer to the source 520 than to the drain 530. In this implementation, therefore, because the gate foot 565 and gate head 665 are created independently, the gate head 665 can be off set toward the source, reducing the gate-to-drain capacitance $C_{gd}$. In power devices for example, since the gate-to-drain capacitance increases by the Miller effect (multiplied by the device's voltage gain), reducing the gate-to-drain capacitance can improve frequency response. In other embodiments, for example in a low noise device such as a low noise amplifier, the gate could be set off toward the drain to minimize the gate-to-source capacitance $C_{gs}$.

Figure 7:
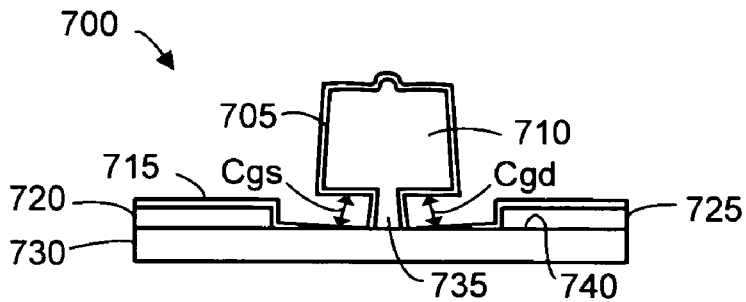
FIG. 7 shows a cross section side view of a prior art T-gate structure transistor.

FIG. 7 is a simplified cross section side view of a T-gate structure transistor 700 showing a non-uniform passivation layer 715 under the gate head 710. Especially at smaller geometries, the passivation layer 715 coverage can be non-uniform near the T-gate structure transistors 700. For example, in FIG. 7 the passivation layer 715 is shown tapering and thinning as it extends under the gate head 710 and approaches the gate foot 735.

As discussed above, the T-gate structure transistor 700 has a T-shaped gate 705 formed over a substrate 730. The T-shaped gate 705 may be a T-gate, a Y-gate, a mushroom gate, a gamma-gate, or an asymmetric gate. The T-shaped gate 705 has a gate foot 735 and a relatively wider gate head 710. While gate lengths less than 100 nanometers are commonly achievable, the short height of the gate foot 735 (the distance between a surface 740 of the substrate 730 and the bottom of the gate head 710) required to produce such short gate lengths, creates unwanted parasitics between the gate head 710 and a source 720, and between the gate head 710 and a drain 725, indicated as $C_{gs}$ and $C_{gd}$, respectively. The short separation between the gate head 710 and the substrate 730 also hinders coverage of a passivation layer 715 on the substrate 730 below the gate head 710.

The gate foot 735 is typically formed on the semiconductor substrate 730 between the source 720 and the drain 725, and the gate head 710 is then formed on the gate foot 735. Once the T-gate structure transistor 700 is formed on the substrate 730, the passivation layer 715 is typically formed on the substrate 730 around the T-shaped gate 705. The passivation layer 715 can insulate the surface 740 of the substrate 730 from the ambient environment and inhibits oxidation of the surface 740. The passivation layer 715 may be a silicon nitride layer formed on the substrate 730 by using a plasma enhanced chemical vapor deposition process.

The passivation layer 715 sometimes may be non-uniform under the gate head 710 around the gate foot 735 because the gate head 710 overhangs the gate foot 735. In the extreme case, the passivation layer 715 will not properly coat and passivate the surface 740 next to the gate foot 735. This can lead to reliability and performance problems over time. In addition, the passivation layer 705 coats the gate head 710, increasing the input capacitance Csg and Cgd, which degrades the frequency response of the T-gate structure transistor 700.

Improved Passivation of the T-Gate

Figure 8A:
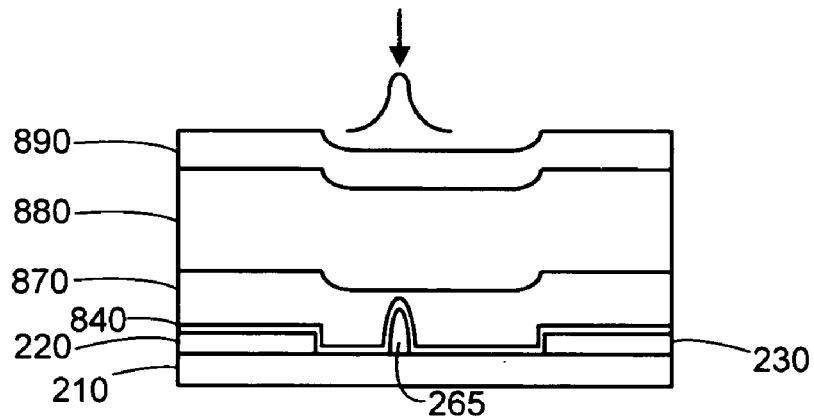
FIGS. 8A-8E are simplified illustrations in cross sectional side view illustrating fabrication of a gate head of a T-gate device in accordance with an implementation of the present invention.

FIGS. 8A-8E are simplified illustrations in cross sectional side view illustrating fabrication of a gate head 860 of a T-gate device 800 (FIG. 8E) in accordance with an implementation of the present invention. The gate foot 265 is formed as described herein with reference to FIGS. 2A-2C. After removal of the resist layer 245, the resist layer 255, and the gate foot material layer 260, a passivation layer 840 is formed on the substrate 210 and the gate foot 265 as shown in FIG. 8A. The passivation layer 840 may be a nitride layer, such as SiN, deposited on the substrate 210 and the gate foot 265 by using a plasma enhanced chemical vapor deposition process. For example, the nitride layer may have a thickness of 500 angstroms. As shown in FIG. 8A, the passivation layer 840 is generally uniform over the substrate 210, and, in particular, around the gate foot 265.

Three layers of resist 870, 880, and 890 are then deposited over the passivation layer 840. Dissimilar resists can be used so that adjacent resist layers do not intermix. The lower resist layer 870 is deposited thick enough to cover the passivation layer 840 and may be a medium sensitivity resist, such as ZEP520A. The middle resist layer 880 acts as a spacer between upper and lower resist layers 890 and 870 and can be relatively thick as compared to resist layers 890 and 870. The middle resist layer 880 may be a copolymer, such as MMA (17.5)/MAA. The upper resist layer 890 can be an imaging layer and may be a medium sensitivity resist, such as PMMA 495k.

A gate head exposure (indicated by an arrow above a gaussian curve at the top of FIG. 8A) is performed to expose resist layers 890, 880, and 870 shown in FIG. 8A. The gate head exposure can be a large area exposure (i.e., a broad exposure), and it is possible to use a low voltage for this exposure, such as 20 kV. The resulting exposure forms a gaussian distribution in the resist layers 870, 880, and 890. This is shown in FIG. 8A as a gaussian like profile.

Figure 8B:
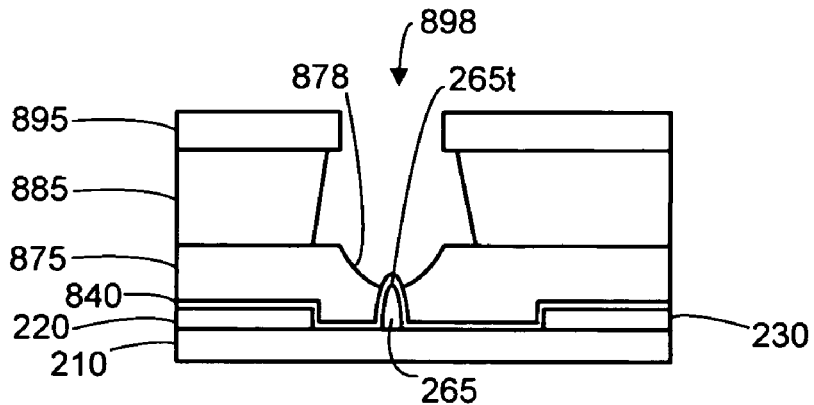
Figure 8C:
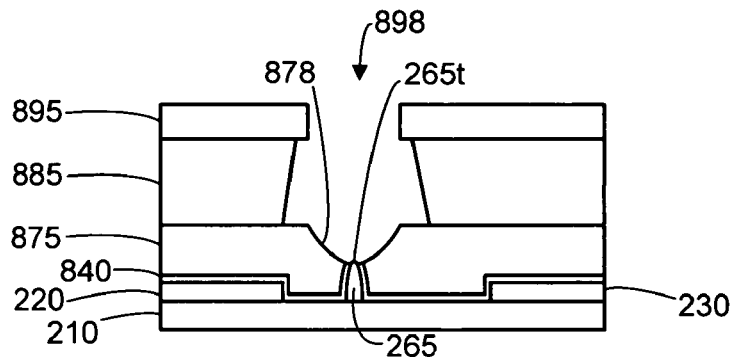

Turning to FIG. 8B, after the gate head exposure, the resist layers 890, 880, and 870 are developed leaving an opening 898 in the mask formed by the resist layers 895, 885, and 875. The opening 898 unmask a portion of the passivation layer 840 on the top 265t of the gate foot 265. The unmasked portion of the passivation layer 840 is then removed from the top 265t of the gate foot 265 to uncover the top 265t of the gate foot 265 as shown in FIG. 8C. For example, the unmasked portion of the passivation layer 840 may be removed by using a dry etch process. The exposure energy and the develop time are selected so that a portion of the passivation layer 840 on the top surface 265t of the gate foot 265 is not covered by resist layers 875, 885 or 895, but some of the passivation layer 840 and some of the lower resist layer 875 remain next to the gate foot 265. Thus, the lower resist layer 875 is not developed all the way through to the substrate 210 to expose the source 220 or drain 230. Instead, the passivation layer 840 and the lower resist layer 870 will remain adjacent the sides of the gate foot 265 and over the source 220 and drain 230 after developing.

Referring to FIG. 8B, after the gate head exposure, a developer is selected which removes the exposed portion of the upper resist layer 895 and part of the middle resist layer 885. For example, Methyl-isobutyl-ketone or MIBK may be used to remove the exposed portion of an upper resist layer 895 formed of PMMA and part of the exposed portion of a middle resist layer 885 formed of MMA(17.5)/MAA copolymer. Next the developed portion of the middle resist layer 885 of MMA(17.5)/MAA copolymer is removed with a PMGEA: ETOH (1:5) solution. This solution does not affect the ZEP520A of the lower resist layer 875 or the upper resist layer 895. A dimple 878 in the lower resist layer 875 is formed using MIBK developer to uncover the portion of the passivation layer 840 on top of the gate foot 265. As shown in FIG. 8B, the dimple 878 may have an arcuate shape.

The energy of the gate head exposure, the type and strength of the developer, and the develop times are selected to ensure that only the portion of the passivation layer 840 on the top portion 265t of the gate foot 265 is uncovered without uncovering the substrate layer 210, the source 220, or the drain 230. In another embodiment, the gate head exposure may include a broad exposure in conjunction with a narrower exposure to create a more tapered shape of the dimple 878.

It should be noted that although the above implementation is discussed with reference to exposure followed by the develop stages, it is possible in other implementations to perform the exposure and develop of resist layers 890, 880, and 870 in one or more alternating exposure and develop stages. In some implementations, it is possible to inspect resist layer 875 to determine if the top of the gate foot 265 is uncovered, before deposition of a gate head 860.

Figure 8D:
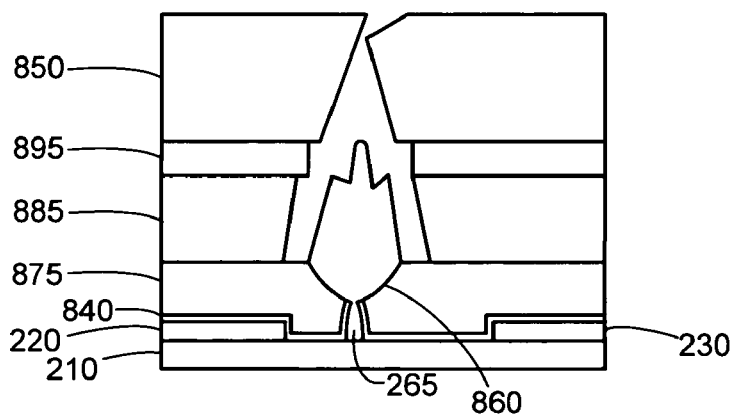

Turning to FIG. 8D, the resist profile formed in the resist layers 895, 885, and 875 define the gate head 860. Since a continuous profile faces the deposition source, during deposition, no voids will form between the gate foot 265 and the gate head 860. Gate head material is deposited in the opening 898 and on the resist layer 895 by a deposition technique known in the art, such as for example by metal evaporation, sputtering, or other deposition technique. The opening 898 in the mask formed by resist layers 895, 885, and 875 defines the gate head 860 during the gate head deposition process.

Figure 8E:
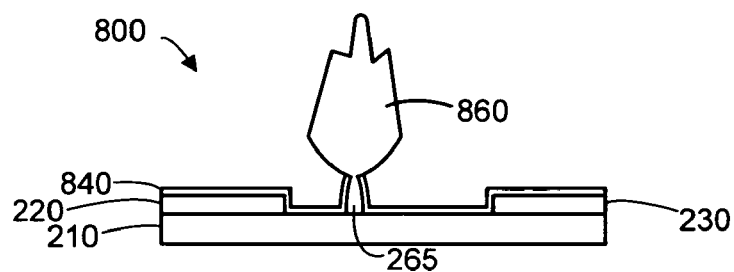

Referring now to FIG. 8E, the gate head material layer 850 is removed with a lift-off process to expose the gate head 860 of the T-gate device 800 while leaving the passivation layer 840 around the gate foot 265. The gate head material layer 850 may be removed by stripping the resist layers 875, 885, and 895 with a solvent, such as acetone. Other resists, developers, and stripper solutions are possible, but should be compatible with the particular substrate material being utilized, i.e. InP, GaAs, GaN, Si, SiC, etc.

In addition to the gate foot 265, the passivation layer 840 around the gate foot 265 may provide some additional support to the gate head 860, which may increase the structural integrity and reliability of the T-gate device 800. Thus, the gate head 860 is supported by a surface that is wider than the top portion 265t of the gate foot 265. This is particularly advantageous at smaller geometries. For example, the gate length may be 60 nm, with the gate foot tapering to about 40-50 nm at its top. A passivation layer of 50 nm on either sidewall of the gate foot may be added to more than triple the width of the surface supporting the gate head. This can improve device reliability and manufacturing yields.

Further, in some embodiments, the improved uniformity and/or thickness of passivation layer 840 allow for decreased capacitance between the gate head 860 and the source 220, and between the gate head 860 and the drain 230.

As shown in FIG. 8E, the gate head 860 may have an arcuate shape extending away from the gate foot 265, formed by the dimple 878 shown in FIG. 8C. The arcuate shape increases the distances between the gate head 860 and both the source 220 and the drain 230. This allows for reduced capacitances between the gate head 860 and both the source 220 and the drain 230. Further, the arcuate shape of the gate head 860 allows the gate foot to be located closer to the source 220 to provide lower source resistance for the T-gate device 800. It is possible, in some embodiments, to form gate head with a more taper shape, or even concave shape as shown in FIG. 4, which allows for further reduction of capacitances and/or source resistance as discussed above.

In various embodiments, the distance between the gate foot 265 and the source 220 is about 300 nm, which results in a low source resistance of the T-gate device 800. Similarly, in some embodiments, the distance between the gate foot 265 and the drain 230 is about 300 nm, which results in a low drain resistance of the T-gate device 800.

In some embodiments, the T-gate transistor 800 will include the source 220 and the drain 230. For example, the T-gate device 800 may be a T-gate transistor constructed of indium phosphide, gallium arsenide, gallium nitride, or antimonide. With some of the above described implementations, it is possible to produce ultra-short, low-resistance T-gate structures for HEMT, HFET, PHEMT, and MESFET devices to eliminate the problem of void formation during metal deposition. Certain implementations may be used to produce reliable T-gate structures for sub-millimeter devices.

As discussed above, some implementations provide the ability to increase distance between the gate head and substrate, to reduce the gate to source capacitance and the gate to drain capacitance. Furthermore, some implementations, allow in situ evaluation of gate length prior to complete fabrication, allowing verification of process parameters during processing, in situ, leading to greater uniformity and yields. Further, improved uniformity across a wafer is achievable.

The above implementations are not limited to the example resists and developers discussed above, or to specific exposure levels. Moreover, although described above with reference to T-gate, gamma gate, and Y-gate structures, the present invention is not limited to these types. Other types of resists and developers may be used. Further, the above implementations are not limited to soft masks and may include hard masks.

Having described this invention in connection with a number of implementations and embodiments, modification will now certainly suggest itself to those skilled in the art. The invention is not intended to be limited to the disclosed implementations and embodiments, except as required by the appended claims.

What is claimed is:

1. A method for fabricating a tiered gate structure transistor comprising:
    forming a source and a drain;
    forming a gate foot between the source and the drain, the gate foot comprising a conductive layer;
    forming a passivation layer extending along an uppermost surface of the source and extending along an uppermost surface of the drain and on the gate foot such that a top portion of the gate foot is not covered with the passivation layer, the passivation layer directly contacting the uppermost surface of the source and the uppermost surface of the drain and surrounding sidewalls of the gate foot; and
    forming a gate head on the gate foot and a portion of the passivation layer, wherein the passivation layer directly contacting the uppermost surface of the source and the uppermost surface of the drain and surrounding the sidewalls of the gate foot providing an additional support to the gate head and increasing a structural integrity of the tiered gate structure transistor.

2. The method of claim 1, wherein forming the passivation layer comprises depositing a passivation layer on the gate foot and etching to remove a portion of the deposited passivation layer to uncover the top portion of the gate foot.

3. The method of claim 1, wherein forming the passivation layer on the gate foot comprises depositing a layer of silicon nitride by using a plasma enhanced chemical vapor deposition process.

4. The method of claim 1, wherein forming the gate head comprises forming the gate head generally centered over the gate foot.

5. The method of claim 1, wherein forming the gate head comprises forming the gate head off-set over the gate foot.

6. The method of claim 1, wherein forming the gate foot comprises forming the gate foot off-set between the source and the drain.

7. A method for fabricating a tiered gate structure transistor comprising a source, a drain, and a gate, the method comprising:
   forming a gate foot mask, the gate foot comprising a conductive layer on a substrate, the gate foot mask having an opening therethrough;
   forming a gate foot in the opening of the gate foot mask;
   removing the gate foot mask;
   forming a passivation layer directly contacting an uppermost surface of the source, an uppermost surface of the drain, the substrate and the gate foot;
   forming a gate head mask over the gate foot, the gate head mask having an opening therethrough exposing a portion of the passivation layer on a top portion of the gate foot;
   removing the portion of the passivation layer to expose the top portion of the gate foot; and
   forming a gate head on the gate foot;
   removing the gate head mask while leaving an unremoved portion of the passivation layer directly contacting the uppermost surface of the source, the uppermost surface of the drain, the substrate and the gate foot.

8. The method of claim 7, wherein forming the gate foot mask comprises depositing a low sensitivity resist over a high sensitivity resist.

9. The method of claim 7, wherein forming the gate foot mask comprises:
   forming a lower resist layer on the substrate;
   forming an upper resist layer on the lower resist layer; and
   forming an opening through the upper resist layer and the lower resist layer with the upper resist layer overhanging the lower resist layer in the opening.

10. The method of claim 9, wherein forming the gate foot mask further comprises:
    using an e-beam to expose the upper and lower resist layers of the gate foot mask; and
    developing the upper and lower resist layers.

11. The method of claim 7, wherein forming the gate head mask comprises:
    forming a lower mask layer on the passivation layer;
    forming an intermediate mask layer on the lower mask layer;
    forming an upper mask layer on the intermediate mask layer; and
    forming the opening through the upper mask layer, the intermediate mask layer, the lower mask layer to expose the portion of the passivation layer on the top portion of the gate foot.

12. The method of claim 11, wherein forming the gate head mask further comprises:
    using an e-beam to expose the upper mask layer, the intermediate mask layer, and the lower mask layer; and
    developing the upper mask layer, the intermediate mask layer, and the lower mask layer.

13. The method of claim 11, wherein forming the gate head mask further comprises:
    using a first e-beam to expose the upper mask layer and the intermediate mask layer;
    developing the upper mask layer and the intermediate mask layer;
    using a second e-beam to expose the lower mask layer; and
    developing the lower mask layer.

14. The method of claim 11, wherein forming the gate head mask comprises developing the intermediate mask layer and the lower mask layer with different developer types.

15. The method of claim 11, wherein forming the gate head on the gate foot comprises depositing a gate head material into a dimple in the lower mask layer of the gate head mask.

16. The method of claim 7, wherein forming the gate foot mask comprises forming the gate foot mask over a source and a drain on the substrate so that the gate foot is formed between the source and the drain.

17. The method of claim 7, wherein forming the passivation layer on the substrate and the gate foot comprises depositing a layer of silicon nitride in a plasma enhanced chemical vapor deposition process.

\* \* \* \* \*